(12) United States Patent
Shiono et al.

(10) Patent No.: US 7,897,319 B2
(45) Date of Patent: *Mar. 1, 2011

(54) POSITIVE RESIST COMPOSITION AND METHOD OF FORMING RESIST PATTERN

(75) Inventors: Daiju Shiono, Kawasaki (JP); Taku Hirayama, Kawasaki (JP); Hideo Hada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 451 days.

This patent is subject to a terminal disclaimer.

(21) Appl. No.: 11/572,630

(22) PCT Filed: Jul. 25, 2005

(86) PCT No.: PCT/JP2005/013564

§ 371 (c)(1),
(2), (4) Date: Jan. 24, 2007

(87) PCT Pub. No.: WO2006/011442

PCT Pub. Date: Feb. 2, 2006

(65) Prior Publication Data

US 2007/0259273 A1 Nov. 8, 2007

(30) Foreign Application Priority Data

Jul. 28, 2004 (JP) ............................. 2004-220111

(51) Int. Cl.
*G03C 1/00* (2006.01)
*G03F 1/00* (2006.01)

(52) U.S. Cl. .................................... 430/270.1; 430/322

(58) Field of Classification Search ............... 430/270.1
See application file for complete search history.

(56) References Cited

U.S. PATENT DOCUMENTS

| | | | |
|---|---|---|---|
| 5,658,706 A | 8/1997 | Niki et al. | |
| 5,693,452 A | 12/1997 | Aoai et al. | |
| 5,707,776 A * | 1/1998 | Kawabe et al. | 430/270.1 |
| 5,824,451 A | 10/1998 | Aoai et al. | |
| 5,837,420 A * | 11/1998 | Aoai et al. | 430/270.1 |
| 5,844,057 A | 12/1998 | Watanabe et al. | |
| 5,994,025 A | 11/1999 | Iwasa et al. | |
| 6,037,098 A | 3/2000 | Aoai et al. | |
| 6,106,993 A | 8/2000 | Watanabe et al. | |
| 6,197,473 B1 | 3/2001 | Kihara et al. | |
| 6,638,683 B1 * | 10/2003 | Tan et al. | 430/270.1 |
| 7,220,808 B2 | 5/2007 | Yamagishi et al. | |
| 7,504,196 B2 * | 3/2009 | Shiono et al. | 430/270.1 |
| 2002/0025495 A1 | 2/2002 | Ogata et al. | |
| 2002/0058205 A1 | 5/2002 | Nakashima et al. | |
| 2003/0232277 A1 | 12/2003 | Sasaki et al. | |
| 2004/0005512 A1 | 1/2004 | Mizutani et al. | |
| 2004/0234885 A1 | 11/2004 | Watanabe et al. | |
| 2005/0271971 A1 | 12/2005 | Ueda et al. | |
| 2007/0259273 A1 | 11/2007 | Shiono et al. | |
| 2007/0281243 A1 | 12/2007 | Hirayama | |
| 2008/0020288 A1 * | 1/2008 | Hirayama et al. | 430/4 |
| 2008/0145784 A1 | 6/2008 | Shiono et al. | |
| 2009/0162781 A1 | 6/2009 | Shiono et al. | |

FOREIGN PATENT DOCUMENTS

| | | |
|---|---|---|
| JP | H05-061197 | 3/1993 |
| JP | H05-249681 | 9/1993 |
| JP | H06-059444 | 3/1994 |
| JP | H06-167811 | 6/1994 |
| JP | H06-266109 | 9/1994 |
| JP | H08-220740 | 8/1996 |
| JP | H08-262712 | 10/1996 |
| JP | H08-337616 | 12/1996 |
| JP | H09-005999 | 1/1997 |
| JP | 09160246 A * | 6/1997 |
| JP | H09-211866 | 8/1997 |
| JP | H10-123703 | 5/1998 |
| JP | H10-274845 | 10/1998 |
| JP | A-11-153863 | 6/1999 |
| JP | H11-167199 | 6/1999 |
| JP | H11-199533 | 7/1999 |
| JP | 2000-086584 | 3/2000 |
| JP | 2000-305270 | 11/2000 |
| JP | 2000-330282 | 11/2000 |

(Continued)

OTHER PUBLICATIONS

JP 09-160246 English translation.*
Hirayama et al., "Development of Amorphous Polyphenol Resists with Low Molecular Weight and Narrow Dispersion for EB Lithography", IEEE Xplore, pp. 10-11, (Oct. 22, 2004).*
Hirayama et al., "Development of Electron Beam Resists based on Amorphous Polyphenols with Low Molecular Weight and Narrow Dispersion", Proceedings of SPIE, vol. 5753, pp. 738-745, (Mar. 2, 2005).*
Office Action issued on Apr. 14, 2008 on the counterpart Korean Patent Application No. 10-2007-7004390.
International Search Report dated Sep. 6, 2005, for PCT/JP2005/013564 filed Jul. 28, 2004.
Office Action issued in corresponding Japanese Patent Application No. 2004-260764, dated Mar. 3, 2009.

(Continued)

*Primary Examiner*—Cynthia H Kelly
*Assistant Examiner*—Connie P Johnson
(74) *Attorney, Agent, or Firm*—Knobbe, Martens, Olson & Bear, LLP

(57) ABSTRACT

A positive resist composition including a base material for a pattern-forming material (A), which contains a protector (X1) of a polyhydric phenol compound (x) having two or more phenolic hydroxyl groups and a molecular weight of 300 to 2,500, in which a portion of the phenolic hydroxyl groups are protected with an acid-dissociable, dissolution-inhibiting group, and an acid generator component (B) that generates an acid upon exposure, wherein the component (B) contains an onium salt-based acid generator (B1) with an alkylsulfonate ion as an anion.

9 Claims, No Drawings

FOREIGN PATENT DOCUMENTS

| | | |
|---|---|---|
| JP | 2001-312055 A | 11/2001 |
| JP | 2002-99088 A | 4/2002 |
| JP | 2002-099089 | 4/2002 |
| JP | 2002-221787 A | 8/2002 |
| JP | A-2002-328473 | 11/2002 |
| JP | 2003-030282 | 1/2003 |
| JP | A-2003-084437 | 3/2003 |
| JP | 2003-183227 | 7/2003 |
| JP | 2003-260881 | 9/2003 |
| JP | 2004-062049 | 2/2004 |
| JP | 2004-125835 | 4/2004 |
| JP | 2004-151605 | 5/2004 |
| JP | A-2004-191913 | 7/2004 |
| JP | 2004-302440 | 10/2004 |
| JP | 2004-359590 | 12/2004 |
| JP | 2002-055452 | 2/2005 |
| JP | 2005-089387 | 4/2005 |
| JP | 2005-091909 | 4/2005 |
| JP | 2005-309421 | 11/2005 |
| KR | 0231242 | 5/1997 |
| KR | 2001-0088341 | 9/2001 |
| KR | 406242 | 11/2003 |
| TW | 200302397 A | 8/2003 |
| TW | 200617602 | 6/2006 |
| WO | WO 2006/046383 | 5/2006 |

OTHER PUBLICATIONS

Decision to Grant a Patent issued in corresponding Japanese Patent Application No. 2004-182301, dated Jan. 6, 2009.
Hirayama et al., Journal of Photopolymer Science and Technology, vol. 17, No. 3, 435-440, (2004).
Hirayama, T., et al. "Depth Profile and Line-Edge Roughness of Low-Molecular-Weight Amorphous Electron Beam Resists", The Japan Journal of Applied Physics, vol. 44, No. 7B, 2005, pp. 5484-5488 (published on Jul. 26, 2005).
Hirayama et al. "Development of Electron Beam Resists Based on Amorphous Polyphenols with Low Molecular Weight and Narrow Dispersion" Proceedings of SPIE vol. 5753, p. 738-745.
International Search Report issued in corresponding PCT application No. PCT/JP2005/018143, mailed Nov. 15, 2005.
International Search Report issued in corresponding PCT Application No. PCT/JP2006/301679, dated Feb. 16, 2006.
International Search Report from PCT/JP2006/302271, mailed on Mar. 7, 2006.
International Search Report issued in corresponding PCT Application No. PCT/JP2006/311443, dated Jun. 7, 2006.
International Search Report in connection with corresponding PCT application No. PCT/JP2006/313103, dated Sep. 26, 2006.
Notice of Allowance issued in related Korean Patent Application No. 10-2009-7006750, dated Feb. 16, 2010.
Office Action issued in counterpart Japanese Patent Application No. 2004-182300, dated May 27, 2008.
Office Action issued in counterpart Japanese Patent Application No. 2004-182301, dated Aug. 26, 2008.
Office Action issued in counterpart Japanese Patent Application No. 2004-182301, dated Jun. 3, 2008.
Office Action issued in counterpart Japanese Patent Application No. 2005-026266, dated Mar. 3, 2009.
Office Action issued in the counterpart Japanese Patent Application No. 2005-050721, dated Mar. 3, 2009.
Office Action issued in counterpart Japanese Patent Application No. JP 2005-050721, dated Jul. 28, 2009.
Office Action issued in Korean Patent Application No. 10-2007-7004390, dated Dec. 17, 2008.
Office Action issued Sep. 16, 2008 in the counterpart Korean Patent Application No. 10-2007-7010473.
Office Action issued on the counterpart Korean Patent Application No. 10-2007-7019433, dated Jun. 5, 2008.
Office Action issued in counterpart Korean Patent Application No. 10-2007-7017441, dated May 7, 2009.
Office Action issued in Korean Patent Application No. 10-2008-7025851, dated Jan. 7, 2009.
Office Action issued in the counterpart Taiwanese Patent Application No. 094104523, dated May 12, 2008.
Yamaguchi et al., Linewidth fluctuations caused by polymer aggregates in resist films, Journal of Photopolymer Science and Technology, vol. 10 No. 4, pp. 635-640, (1997).
Hirayama et al, "Development of Amorphous PolyPhenol Resists with Low Molecular Weight and Narrow Dispersion for EB Lithography", IEEE Xplore, Oct. 22, 2004, pp. 10-11.
Notice of Allowance issued on corresponding Japanese Patent Application No. 2004-260764, dated Feb. 16, 2010.
Office Action issued in corresponding U.S. Appl. No. 10/590,046, dated Mar. 17, 2010.
Office Action issued in corresponding U.S. Appl. No. 10/590,046, dated Sep. 21, 2009.
Office Action issued in corresponding U.S. Appl. No. 10/590,046, dated Apr. 24, 2009.
Office Action issued in corresponding U.S. Appl. No. 10/590,046, dated Sep. 26, 2008.
Office Action issued in corresponding U.S. Appl. No. 11/574,805 dated Feb. 26, 2010.
Office Action issued in corresponding U.S. Appl. No. 11/574,805 dated Aug. 4, 2009.
Office Action issued in corresponding U.S. Appl. No. 11/574,805 dated May 19, 2009.
Office Action issued in corresponding U.S. Appl. No. 11/574,805 dated Aug. 19, 2008.
Office Action issued in corresponding U.S. Appl. No. 11/574,805 dated Feb. 10, 2009.
Office Action issued in corresponding U.S. Appl. No. 11/718,091 dated Apr. 23, 2010.
Office Action issued in corresponding U.S. Appl. No. 11/718,091 dated Sep. 14, 2009.
Office Action issued in corresponding U.S. Appl. No. 11/813,511, dated Apr. 28, 2010.
Office Action issued in corresponding U.S. Appl. No. 11/813,511, dated Oct. 8, 2009.
Office Action issued in corresponding U.S. Appl. No. 11/884,748, dated Jul. 7, 2008.
Office Action issued in corresponding U.S. Appl. No. 11/914,451 dated May 3, 2010.
Office Action issued in corresponding U.S. Appl. No. 11/914,451 dated Oct. 8, 2009.
Office Action issued in corresponding U.S. Appl. No. 11/917,458, dated Apr. 5, 2010.
Office Action issued in corresponding U.S. Appl. No. 11/994,602, dated Mar. 8, 2010.
European Search Report issued in related European Patent Application No. EP 06732357.6, dated Aug. 30, 2010.

* cited by examiner

POSITIVE RESIST COMPOSITION AND METHOD OF FORMING RESIST PATTERN

RELATED APPLICATIONS

This application is the U.S. National Phase filing under 35 U.S.C. §371 of PCT/JP2005/013564, filed Jul. 25, 2005, which designated the United States and was published in a language other than English, which claims priority under 35 U.S.C. §119(a)-(d) to Japanese Patent Application No. 2004-220111, filed Jul. 28, 2004. The content of these applications is incorporated herein by reference in their entireties.

TECHNICAL FIELD

The present invention relates to a positive resist composition and a method of forming a resist pattern.

BACKGROUND ART

In recent years, in the production of semiconductor elements and liquid crystal display elements, advances in lithography techniques have lead to rapid progress in the field of miniaturization of a pattern. Typically, these miniaturization techniques involve shortening the wavelength of the exposure light source. Conventionally, ultraviolet radiation such as g-line and i-line radiation has been used, but nowadays, mass production of semiconductor elements using KrF excimer lasers and ArF excimer lasers has commenced, and technology that uses extreme ultraviolet (EUV) or an electron beam (EB) as the radiation source is also attracting considerable attention. Furthermore, one example of a known pattern-forming material capable of forming a pattern of minute dimensions is a chemically amplified resist, which includes a base material component with a film-forming capability, and an acid generator component that generates an acid upon exposure. Chemically amplified resists include negative compositions, which undergo a reduction in alkali solubility on exposure, and positive compositions, which exhibit increased alkali solubility on exposure. Conventionally, polymers are used as the base material component.

When a pattern is formed using this type of pattern-forming material, a problem arises in that roughness is generated on the upper surface and side wall surfaces of the pattern, and this problem becomes more severe as the pattern dimensions are reduced. For example, because EUV and EB lithography are targeting the formation of very fine patterns of several tens of nm, ultra low levels of roughness surpassing the current levels of pattern roughness are required.

However, the polymers that are typically used as base materials have a large molecular size (root mean squared radius per molecule) of approximately several nm. During the developing step of the pattern formation process, the dissolution behavior of the resist in the developing solution usually occurs at the single molecular unit level of the base material, meaning that as long as a polymer is used as the base material component, further reductions in the level of roughness will prove extremely difficult.

In response to these problems, resists that use low molecular weight materials as the base material component have been proposed as materials capable of targeting ultra low levels of roughness. For example, patent references 1 and 2 propose low molecular weight materials containing alkali-soluble groups such as hydroxyl groups, wherein either a portion of, or all of, the alkali-soluble groups are protected with acid-dissociable, dissolution-inhibiting groups. These low molecular weight materials have small molecular sizes as a result of their lower molecular weight, and are expected to enable reductions in the level of roughness.

(Patent Reference 1)
Japanese Unexamined Patent Application, First Publication No. 2002-099088
(Patent Reference 2)
Japanese Unexamined Patent Application, First Publication No. 2002-099089

DISCLOSURE OF INVENTION

However, investigations by the inventors of the present invention revealed that when low molecular weight materials are used as the base material component, the resist is more prone to effects caused by the surrounding environment within the resist film than the case of a resist that uses a conventional polymer material.

For example, the solubility of the resist film in the developing solution is more likely to be affected by materials other than the low molecular weight material, and dissolution-inhibiting effects caused by the acid generator or other materials (for example, a nitrogen-containing organic compound such as a tertiary amine) are greater than those observed for resists that use polymer materials. The dissolution-inhibiting effect of the acid generator is particularly large, and tends to cause a deterioration in the pattern shape, including the generation of patterns in which the cross-sectional shape is a T-top shape.

On the other hand, in EUV and EB lithography, problems relating to the intensity of the exposure source mean that improvements in the sensitivity of the resist are required. One example of a possible method of achieving a higher level of sensitivity involves increasing the concentration of the acid generator. However, addition of a high concentration of the acid generator tends to cause a deterioration in the resolution. As a result, incorporating a high concentration of the acid generator tends to be problematic, and there is a limit to the improvement in sensitivity that can be achieved using this method.

The present invention takes the above circumstances into consideration, with an object of providing a positive resist composition and a method of forming a resist pattern that provide excellent pattern shape, sensitivity, and resolution.

As a result of intensive investigation, the inventors of the present invention discovered that the above object could be achieved by combining a base material for a pattern-forming material, which contains a protector of a polyhydric phenol compound with a specific low molecular weight in which the phenolic hydroxyl groups are protected with acid-dissociable, dissolution-inhibiting groups, and a specific acid generator, and they were thus able to complete the present invention.

In other words, a first aspect of the present invention is a positive resist composition including a base material for a pattern-forming material (A), which contains a protector (X1) of a polyhydric phenol compound (x) having two or more phenolic hydroxyl groups and a molecular weight of 300 to 2,500, in which a portion of the phenolic hydroxyl groups are protected with an acid-dissociable, dissolution-inhibiting group, and an acid generator component (B) that generates an acid upon exposure, wherein the component (B) contains an onium salt-based acid generator (B1) with an alkylsulfonate ion as an anion.

Furthermore, a second aspect of the present invention is a method of forming a resist pattern that includes forming a resist film on a substrate using the positive resist composition according to the first aspect, exposing the resist film, and developing the resist film to form the resist pattern.

In this description, the term "exposure" is used as a general concept that includes irradiation with any form of radiation.

According to the present invention, there are provided a positive resist composition and a method of forming a resist pattern that provide excellent pattern shape, sensitivity, and resolution.

BEST MODE FOR CARRYING OUT THE INVENTION

As follows is a more detailed description of the present invention.

<<Positive Resist Composition>>

A positive resist composition of the present invention includes a base material for a pattern-forming material (A) (hereafter also referred to as the component (A)), which contains a protector (X1) of a polyhydric phenol compound (x) having two or more phenolic hydroxyl groups and a molecular weight of 300 to 2,500, in which a portion of the phenolic hydroxyl groups are protected with an acid-dissociable, dissolution-inhibiting group, and an acid generator component (B) (hereafter also referred to as the component (B)) that generates an acid upon exposure.

<Component (A)>

In the present invention, the component (A) is a base material for a pattern-forming material which contains a protector (X1) of a polyhydric phenol compound (x) having two or more phenolic hydroxyl groups and a molecular weight of 300 to 2,500, in which either a portion of, or all of, the phenolic hydroxyl groups are protected with an acid-dissociable, dissolution-inhibiting group.

In this description, the polyhydric phenol compound (x) refers to the compound prior to protection with the acid-dissociable, dissolution-inhibiting groups, whereas the compound that has been protected with the acid-dissociable, dissolution-inhibiting groups is referred to as the protector (X1), and the component (A) contains this protector (X1).

In the component (A), the action of the acid generated from the component (B) upon exposure causes the acid-dissociable, dissolution-inhibiting groups to dissociate, and this causes the entire component (A) to change from an alkali-insoluble state to an alkali-soluble state. As a result, when a resist film formed from the positive resist composition is selectively exposed during the formation of a resist pattern, or alternatively is exposed and then subjected to post exposure baking, the exposed portions of the resist shift to an alkali-soluble state, whereas the unexposed portions remain insoluble in alkali, meaning alkali developing can then be used to form a positive resist pattern.

[Polyhydric Phenol Compound (x)]

There are no particular restrictions on the polyhydric phenol compound (x) used in the formation of the protector (X1), provided the compound is a polyhydric phenol compound having two or more phenolic hydroxyl groups and a molecular weight within a range from 300 to 2,500, and examples of suitable compounds include the polyhydric phenol compounds known as sensitizers or heat resistance improvement agents for non-chemically amplified g-line or i-line resists. Specific examples of these polyhydric phenols include the compounds listed below:

bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, bis(4-hydroxy-3,5-dimethylphenyl)-2-hydroxyphenylmethane, bis(4-hydroxy-3,5-dimethylphenyl)-4-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(4-hydroxy-3-methylphenyl)-2-hydroxyphenylmethane, bis(3-cyclohexyl-4-hydroxy-6-methylphenyl)-2-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(4-hydroxy-3,5-dimethylphenyl)-2-hydroxyphenylmethane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, 1-[1-(4-hydroxyphenyl)isopropyl]-4-[1,1-bis(4-hydroxyphenyl)ethyl]benzene, and four-benzene ring compounds of formalin condensation products of phenols such as phenol, m-cresol, p-cresol and xylenol.

In the present invention, a polyhydric phenol compound represented by a general formula (I) shown below provides particularly superior effects for the present invention, and is consequently preferred.

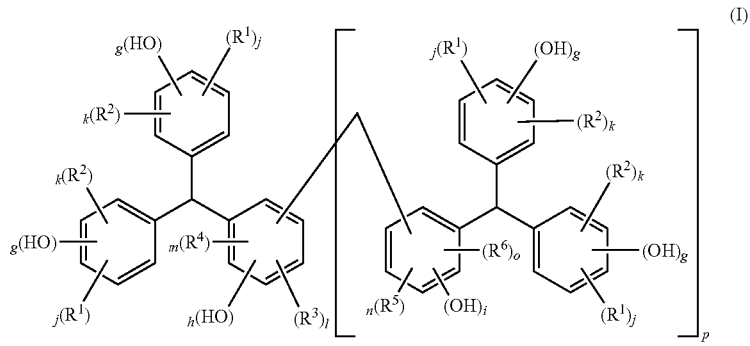

In the above formula, $R^1$ through $R^6$ each represent, independently, a straight-chain, branched, or cyclic alkyl group of 1 to 10 carbon atoms or an aromatic hydrocarbon group. The alkyl group is preferably a lower alkyl group of 1 to 5 carbon atoms or a cyclic alkyl group of 5 to 6 carbon atoms. These alkyl groups or aromatic hydrocarbon groups may include a hetero atom such as an oxygen atom, nitrogen atom, or sulfur atom within the structure. Specific examples of suitable aromatic hydrocarbon groups include a phenyl group, tolyl group, xylyl group, mesityl group, phenethyl group, or naphthyl group.

g and j each represent, independently, an integer of 1 or greater, and preferably an integer from 1 to 2, k represents either 0 or an integer of 1 or greater, and preferably an integer that does not exceed 2, and g+j+k is no greater than 5.

h is an integer of 1 or greater, and preferably an integer from 1 to 2, l and m each represent, independently, either 0 or an integer of 1 or greater, and preferably an integer that does not exceed 2, and h+l+m is no greater than 4.

i is an integer of 1 or greater, and preferably an integer from 1 to 2, n and o each represent, independently, either 0 or an integer of 1 or greater, and preferably an integer that does not exceed 2, and i+n+o is no greater than 4.

p is either 0 or 1, and is preferably 1.

Of these possibilities, compounds in which $R^1$ is a cycloalkyl group, j is 1, $R^2$ is a lower alkyl group, k is 1, and g is 1 are preferred.

In addition, compounds in which $R^1$ is a cyclohexyl group, j is 1, $R^2$ is a lower alkyl group, k is 1, and g is 1, and moreover, l, m, n and o are zero, and h and i are both 1 enable the formation of a fine pattern with reduced roughness and a high level of resolution, and are consequently preferred.

Of the polyhydric phenol compounds represented by the above general formula (I), the most preferred compounds are the polyhydric phenol compounds represented by formulas (II) and (III) shown below.

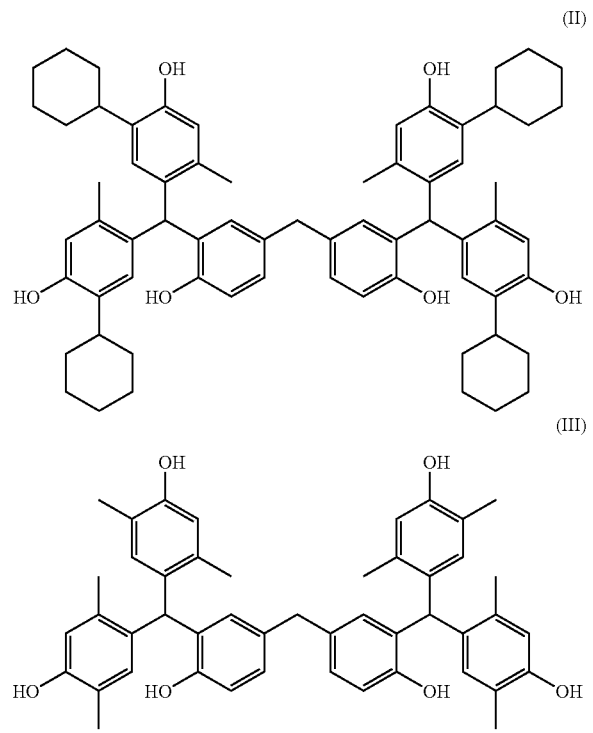

In the present invention, the polyhydric phenol compound (x) must have a molecular weight within a range from 300 to 2,500, and this molecular weight is preferably from 450 to 1,500, and even more preferably from 500 to 1,200. By ensuring that the molecular weight is no higher than the above upper limit, roughness is reduced, the pattern shape is further improved, and the resolution also improves. Furthermore, ensuring that the molecular weight is at least as large as the lower limit enables the formation of a resist pattern with a favorable profile shape.

Furthermore, if the molecular weight polydispersity (Mw/Mn) for the polyhydric phenol compound (x) is no higher than 1.5, then the effects of the present invention are further improved. It is thought that the reason for this observation is that as the molecular weight distribution for the polyhydric phenol compound (x) narrows, the alkali solubility levels of the various protectors and the unprotector become more uniform. Smaller polydispersity values are preferred, and the polydispersity value is even more preferably no more than 1.4, and is most preferably 1.3 or smaller. In the case where the polyhydric phenol compound (x) used in the aforementioned base material is a single compound, the polydispersity value is 1.

The polydispersity can be adjusted either by removing reaction by-products and impurities following synthesis of the polyhydric phenol compound (x) that represents the targeted product, or by using conventional methods such as molecular weight fractionation treatments to remove the unneeded molecular weight fractions.

The polydispersity is calculated by measuring the weight average molecular weight (Mw) and the number average molecular weight (Mn) using a typical method used for the measurement of these Mw and Mn values for a polymer, such as a gel permeation chromatography method, and then determining the Mw/Mn ratio.

[Protector (X1)]

The protector (X1) is a compound in which either a portion of, or all of, the phenolic hydroxyl groups of the aforementioned polyhydric phenol compound (x) have been protected by substitution with acid-dissociable, dissolution-inhibiting groups.

There are no particular restrictions on the acid-dissociable, dissolution-inhibiting groups, and any group can be selected from amongst the various acid-dissociable, dissolution-inhibiting groups proposed for use within the hydroxystyrene-based resins and (meth)acrylate-based resins and the like used within conventional KrF and ArF chemically amplified resist compositions.

Specific examples of suitable groups include chain-like alkoxyalkyl groups, tertiary alkyloxycarbonyl groups, tertiary alkyl groups, tertiary alkoxycarbonylalkyl groups, and cyclic ether groups.

Examples of suitable chain-like alkoxyalkyl groups include a 1-ethoxyethyl group, 1-ethoxymethyl group, 1-methoxymethylethyl group, 1-methoxymethyl group, 1-isopropoxyethyl group, 1-methoxypropyl group, 1-ethoxypropyl group, and 1-n-butoxyethyl group.

Examples of suitable tertiary alkyloxycarbonyl groups include a tert-butyloxycarbonyl group and tert-amyloxycarbonyl group.

Examples of suitable tertiary alkyl groups include chain-like tertiary alkyl groups such as a tert-butyl group and tert-amyl group, and tertiary alkyl groups that include an aliphatic polycyclic group such as a 2-methyladamantyl group and 2-ethyladamantyl group.

Examples of suitable tertiary alkoxycarbonylalkyl groups include a tert-butyloxycarbonylmethyl group and tert-amyloxycarbonylmethyl group. Examples of suitable cyclic ether groups include a tetrahydropyranyl group and tetrahydrofuranyl group.

Of these groups, in terms of providing excellent dissociability, enhancing the uniformity of the protector (X1), and improving the level of roughness, a chain-like alkoxyalkyl group is preferred, and a 1-ethoxyethyl group or 1-ethoxymethyl group is particularly desirable.

Furthermore, in those cases where the protector (X1) includes a plurality of polyhydric phenol compounds (hereafter also referred to as isomers) with different numbers of phenolic hydroxyl groups protected with acid-dissociable, dissolution-inhibiting groups (that is, different protection numbers), materials in which the protection numbers for each isomer are close in value produce superior effects for the present invention, and are consequently preferred.

The proportion of the protector (X1), and proportions of each of the isomers of the protector (X1), within the component (A) can be measured using a technique such as reverse-phase chromatography.

The proportion of the protector (X1) within the component (A) is preferably greater than 40% by weight, even more preferably greater than 50% by weight, even more preferably greater than 80% by weight, and is most preferably 100% by weight.

The protector (X1) can be produced, for example, by a method in which either all of, or a portion of, the phenolic hydroxyl groups of either one, or two or more polyhydric phenol compounds (x) are protected with acid-dissociable, dissolution-inhibiting groups using known techniques.

Furthermore, in the protector (X1), the protection number of each of the isomers can be adjusted by altering the conditions used during the method of protecting the hydroxyl groups with the acid-dissociable, dissolution-inhibiting groups.

[Unprotector (X2)]

The component (A) may also include an unprotector (X2) of the aforementioned polyhydric phenol compound (x), in which none of the phenolic hydroxyl groups are protected with acid-dissociable, dissolution-inhibiting groups.

The unprotector (X2) is a compound in which absolutely none of the phenolic hydroxyl groups within the polyhydric phenol compound (x) are protected with acid-dissociable, dissolution-inhibiting groups, in other words, the polyhydric phenol compound (x) itself.

In the component (A), the proportion of this unprotector (X2) is preferably kept as low as possible, and is preferably no higher than 60% by weight, even more preferably no higher than 50% by weight, even more preferably 10% by weight or less, and is most preferably 0% by weight. Provided the quantity of the unprotector (X2) is no higher than 60% by weight, the level of roughness upon pattern formation can be reduced. Moreover, the resolution is also superior.

The proportion of the unprotector (X2) within the component (A) can be adjusted, for example, by using gel permeation chromatography (GPC) to remove the unprotector (X2).

The proportion of the unprotector (X2) within the component (A) can be measured using a technique such as reverse-phase chromatography.

Furthermore, from the viewpoints of resolution and the roughness reduction effect, the phenolic hydroxyl group protection ratio within the component (A), that is, the proportion of phenolic hydroxyl groups that have been protected with acid-dissociable, dissolution-inhibiting groups relative to the combined total of phenolic hydroxyl groups that have been protected with acid-dissociable, dissolution-inhibiting groups and unprotected phenolic hydroxyl groups, is preferably within a range from 5 to 50 mol %, and even more preferably from 7 to 30 mol %.

The quantity of the component (A) within a positive resist composition of the present invention may be adjusted in accordance with the film thickness of the resist to be formed.

<Component (B)>

In the present invention, the component (B) contains an onium salt-based acid generator (B1) with an alkylsulfonate ion as an anion.

There are no particular restrictions on the onium salt-based acid generator (B1), provided the salt includes an alkylsulfonate ion as an anion, and there are also no particular restrictions on the cation that forms the salt in combination with the anion, and any of the cations of known acid generators proposed for use within conventional chemically amplified resist compositions may be used. Examples of such cations include sulfonium ions and iodonium ions and the like.

In the present invention, an onium salt-based acid generator (B1) that includes an onium salt represented by a general formula (B-1) shown below yields excellent effects for the present invention, and is consequently preferred.

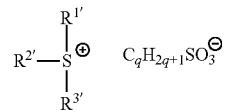

(B-1)

[wherein, $R^{1'}$ to $R^{3'}$ each represent, independently, an aryl group or alkyl group, and q represents an integer from 1 to 10]

In the formula (B-1), $R^{1'}$ to $R^{3'}$ each represent, independently, an aryl group or alkyl group, although of $R^{1'}$ to $R^{3'}$, at least one group preferably represents an aryl group, salts in which two or more groups represent aryl groups are even more preferred, and salts in which $R^{1'}$ to $R^{3'}$ all represent aryl groups are the most desirable.

There are no particular restrictions on the aryl groups of $R^{1'}$ to $R^{3'}$, and suitable examples include aryl groups of 6 to 20 carbon atoms, including phenyl groups or naphthyl groups which may, or may not, be substituted with an alkyl group or halogen atom or the like. From the viewpoint of enabling low-cost synthesis, aryl groups of 6 to 10 carbon atoms are preferred.

There are no particular restrictions on the alkyl groups of $R^{1'}$ to $R^{3'}$, and suitable examples include straight-chain, branched or cyclic alkyl groups of 1 to 10 carbon atoms. Because they offer superior resolution, alkyl groups of 1 to 5 carbon atoms are preferred. Specific examples of suitable groups include a methyl group, ethyl group, n-propyl group, isopropyl group, n-butyl group, isobutyl group, n-pentyl group, cyclopentyl group, hexyl group, cyclohexyl group, nonyl group, or decanyl group. In terms of achieving superior resolution and enabling low-cost synthesis, a methyl group is preferred.

Of the above possibilities, salts in which $R^{1'}$ to $R^{3'}$ all represent phenyl groups are the most desirable.

q is an integer from 1 to 10, preferably an integer from 1 to 8, even more preferably an integer from 4 to 8, and is most preferably either 4 or 8 in terms of the ease of industrial synthesis.

Furthermore, examples of the alkyl group represented by $C_qH_{2q+1}$ include both straight-chain and branched groups, although straight-chain alkyl groups are preferred, including groups such as a methyl group, ethyl group, n-propyl group, n-butyl group, n-pentyl group, n-hexyl group, n-heptyl group, n-octyl group, n-nonyl group, or n-decyl group.

The onium salt-based acid generator (B1) may be used either alone, or in combinations of two or more different materials.

In the present invention, the component (B) may also include other known acid generators (hereafter also referred to as other acid generators (B2)) used in conventional chemically amplified resists, although in order to ensure satisfactory effects for the present invention, the proportion of the onium salt-based acid generator (B1) within the component (B) is preferably within a range from 50 to 100% by weight, and even more preferably from 80 to 100% by weight, of the total component (B), and a proportion of 100% by weight is the most desirable.

Examples of the other acid generator (B2) are numerous, and include onium salt-based acid generators such as iodonium salts and sulfonium salts (but excluding the onium salt-based acid generator (B1)), oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

Amongst these other acid generators (B2), specific examples of suitable onium salt-based acid generators other than the onium salt-based acid generator (B1) include diphenyliodonium trifluoromethanesulfonate or nonafluorobutanesulfonate, triphenylsulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, and (4-methoxyphenyl)diphenylsulfonium trifluoromethanesulfonate, heptafluoropropanesulfonate or nonafluorobutanesulfonate.

Specific examples of suitable oxime sulfonate-based acid generators include α-(p-toluenesulfonyloxyimino)-benzyl cyamide, α-(p-chlorobenzenesulfonyloxyimino)-benzyl cyamide, α-(4-nitrobenzenesulfonyloxyimino)-benzyl cyamide, α-(4-nitro-2-trifluoromethylbenzenesulfonyloxyimino)-benzyl cyamide, α-(benzenesulfonyloxyimino)-4-chlorobenzyl cyamide, α-(benzenesulfonyloxyimino)-2,4-dichlorobenzyl cyamide, α-(benzenesulfonyloxyimino)-2,6-dichlorobenzyl cyamide, α-(benzenesulfonyloxyimino)-4-methoxybenzyl cyamide, α-(2-chlorobenzenesulfonyloxyimino)-4-methoxybenzyl cyamide, α-(benzenesulfonyloxyimino)-thien-2-yl acetonitrile, α-(4-dodecylbenzenesulfonyloxyimino)-benzyl cyamide, α-[(p-toluenesulfonyloxyimino)-4-methoxyphenyl] acetonitrile, α-[(dodecylbenzenesulfonyloxyimino)-4-methoxyphenyl]acetonitrile, α-(tosyloxyimino)-4-thienyl cyamide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl)decane (compound D, decomposition point 147° C.), 1,2-bis(cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, melting point 109° C., decomposition point 122° C.), and 1,10-bis(cyclohexylsulfonyldiazomethylsulfonyl)decane (compound H, decomposition point 116° C.).

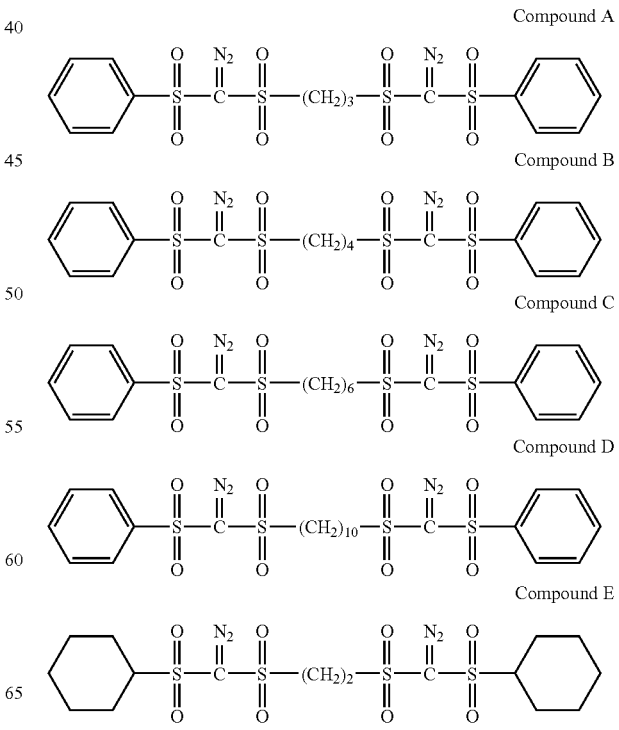

-continued

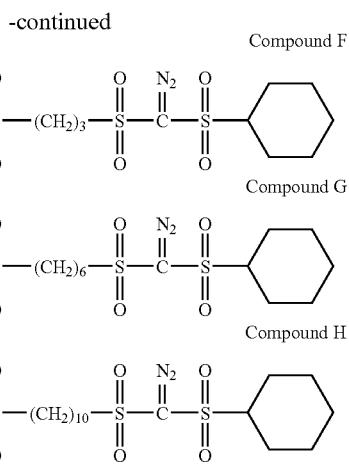

Compound F

Compound G

Compound H

As the other acid generator (B2), either one of the above acid generators may be used alone, or a combination of two or more different acid generators may be used.

The quantity used of the component (B) is typically within a range from 0.1 to 60 parts by weight, preferably from 10 to 60 parts by weight, and even more preferably from 15 to 50 parts by weight, per 100 parts by weight of the component (A). Ensuring this quantity is at least as large as the lower limit of the above range enables the effects of the present invention to manifest satisfactorily. If the quantity exceeds the above range, then obtaining a uniform solution becomes problematic, which can cause a deterioration in the level of defects or the storage stability.

Generally, the blend quantity of a component (B) within a resist composition is limited to less than 10 parts by weight per 100 parts by weight of the component (A) in consideration of the resulting effects on the resolution and the pattern shape. In contrast, in the present invention, there are almost no adverse effects on the resolution or pattern shape even when the component (B) is added at a high concentration, and as a result, the component (B) can be added at high concentration levels exceeding 20 parts by weight.

<Component (C)>

A resist composition of the present invention can be produced by dissolving the component (A) and component (B), and any of the optional components described below, in an organic solvent (C) (hereafter also referred to as the component (C)).

The component (C) may be any solvent capable of dissolving each of the components used to generate a uniform solution, and either one, or two or more solvents selected from known materials used as the solvents for conventional chemically amplified resists can be used.

Suitable examples include ketones such as γ-butyrolactone, acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent of two or more different solvents.

Furthermore, a mixed solvent formed by mixing propylene glycol monomethyl ether acetate (PGMEA) and a polar solvent is preferred. The mixing ratio (weight ratio) in such a solvent can be determined on the basis of the co-solubility of the PGMEA and the polar solvent, but is preferably within a range from 9:1 to 1:9, and even more preferably from 8:2 to 2:8.

More specifically, in those cases where EL is added as the polar solvent, the weight ratio of PGMEA:EL is preferably within a range from 8:2 to 2:8, and even more preferably from 7:3 to 3:7.

Furthermore, as the component (C), a mixed solvent of at least one of PGMEA and EL, together with γ-butyrolactone is also preferred. In such cases, the mixing ratio is set so that the weight ratio between the former and latter components is preferably within a range from 70:30 to 95:5.

Furthermore, the use of propylene glycol monomethyl ether (PGME) as the component (C) is also preferred.

There are no particular restrictions on the quantity used of the component (C), which is set in accordance with the coating film thickness so as to produce a concentration that enables favorable application to a support such as a substrate or the like, and is typically sufficient to produce a solid fraction concentration within the resist composition of 2 to 20% by weight, and preferably from 5 to 15% by weight.

<Component (D)>

In a resist composition of the present invention, in order to improve the resist pattern shape and the post exposure stability of the latent image formed by the pattern-wise exposure of the resist layer, a nitrogen-containing organic compound (D) (hereafter referred to as the component (D)) can be added as an optional component.

A multitude of these organic compounds have already been proposed, and any of these known compounds can be used as the component (D), including monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Of these, secondary lower aliphatic amines and tertiary lower aliphatic amines are preferred, and tri-n-octylamine is the most preferred.

These compounds can be used either alone, or in combinations of two or more different compounds.

The component (D) is typically used in a quantity within a range from 0.01 to 5.0 parts by weight per 100 parts by weight of the component (A).

<Component (E)>

Furthermore, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter referred to as the component (E)) can also be added as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

<Other Optional Components>

Other miscible additives can also be added to a positive resist composition of the present invention according to need, and examples include additive resins for improving the performance of the resist film, surfactants for improving the ease of application, dissolution inhibitors, plasticizers, stabilizers, colorants, and halation prevention agents.

Examples of suitable additive resins include those resins proposed as base resins for conventional chemically amplified KrF positive resist compositions and ArF positive resist compositions, and these resins can be selected appropriately in accordance with the type of exposure light source used during resist pattern formation. The proportion of these additive resins must be kept within a range that does not impair the effects of the present invention, and is preferably no higher than 20% by weight, and even more preferably 10% by weight or less, relative to the total solid fraction of the positive resist composition.

<<Method of Forming Resist Pattern>>

Using a positive resist composition of the present invention, a resist pattern can be formed using, for example, the type of resist pattern formation method described below.

Namely, a positive resist composition described above is first applied to the surface of a substrate such as a silicon wafer using a spinner or the like, a prebake is conducted under temperature conditions of 80 to 150° C. for 40 to 120 seconds, and preferably for 60 to 90 seconds, and the resulting film is then subjected to selective exposure with an electron beam or extreme ultraviolet radiation or the like, using an electron beam lithography apparatus or the like. In other words, following exposure through a mask pattern or patterning of the resist film by direct irradiation with an electron beam without using a mask pattern, PEB (post exposure baking) is conducted under temperature conditions of 70 to 150° C. for 40 to 500 seconds, and preferably for 60 to 400 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the substrate and the applied layer of the resist composition.

There are no particular restrictions on the wavelength of radiation used for the exposure, and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. A positive resist composition according to the present invention is particularly useful for irradiation using EB and EUV, and especially for EB.

As described above, a positive resist composition and a method of forming a resist pattern according to the present invention enable the formation of a resist pattern that exhibits excellent pattern shape, sensitivity, and resolution.

The reasons for these observations are thought to include the fact that the dissolution-inhibiting effect of the onium salt-based acid generator (B1) is small, and the fact that the solubility of the onium salt-based acid generator (B1) in water is high. In other words, it is surmised that because the dissolution-inhibiting effect of the onium salt-based acid generator (B1) is small, the component (B) has minimal adverse effects on the resolution and pattern shape, and as a result, the sensitivity can be further improved by adding the component (B) at a high concentration level. Furthermore, it is thought that because the water solubility of the onium salt-based acid generator (B1) is high, the resist film is more readily compatible with the developing solution and rinse solution, which yields an improvement in the resolution.

EXAMPLES

As follows is a description of examples of the present invention, although the present invention is in no way limited by these examples.

Production Example 1

10 g of the polyhydric phenol compound represented by the above formula (II) (molecular weight: 981, hereafter abbreviated as MBSA) was dissolved in 33 g of tetrahydrofuran, 1.8 g of ethyl vinyl ether was added, and the resulting mixture was reacted for 12 hours at room temperature under constant stirring. Following completion of the reaction, the product was extracted and purified using a water/ethyl acetate system. This yielded 10.1 g of a MBSA protector (a1).

Using a 400 MHz proton NMR apparatus manufactured by JEOL Ltd., the number of phenolic hydroxyl groups within the MBSA protector (a1), and the number of phenolic hydroxyl groups protected with 1-ethoxyethyl groups were measured, and determination of the protection ratio (mol %) revealed a value of 19.9 mol %. The protection ratio is determined using the formula: {number of phenolic hydroxyl groups protected with 1-ethoxyethyl groups/(number of phenolic hydroxyl groups+number of phenolic hydroxyl groups protected with 1-ethoxyethyl groups)}×100.

Example 1

100 parts by weight of the MBSA protector (a1) obtained in the production example 1, 20 parts by weight of triphenylsulfonium n-butanesulfonate, and 1 part by weight of tri-n-octylamine were dissolved in 1540 parts by weight of a mixed solvent of propylene glycol monomethyl ether acetate (PGMEA)/ethyl lactate (EL)=6/4 (weight ratio) (hereafter this mixed solvent is abbreviated as EM), thus forming a positive resist composition solution.

Subsequently, the thus obtained positive resist composition solution was applied uniformly, using a spinner, to the surface of an 8-inch silicon substrate that had been treated with hexamethyldisilazane, and was then subjected to a bake treatment (post applied bake (PAB)) at 120° C. for 90 seconds, thus forming a resist film (film thickness: 150 nm).

This resist film was then subjected to direct patterning with an electron beam lithography apparatus (HL-800D, manufactured by Hitachi Ltd., accelerating voltage: 70 kV), and was then subjected to a bake treatment (post exposure baking (PEB)) at 100° C. for 90 seconds, developed for 60 seconds in a 2.38% by weight aqueous solution (at 23° C.) of tetramethylammonium hydroxide (TMAH), and rinsed in pure water for 30 seconds, thus forming a line and space (L/S) pattern. The thus obtained resist pattern was subjected to the evaluations described below. The results of the evaluations are shown in Table 1.

<Sensitivity>

The exposure time required to form a 100 nm line and space pattern in a 1:1 ratio was measured as the sensitivity ($E_{OP}$) in units of $\mu C/cm^2$ (the quantity of energy).

<Pattern Shape>

The cross-sectional shape of a 100 nm L/S pattern formed at the above $E_{OP}$ level was inspected and evaluated using a SEM photograph.

<Resolution>

L/S patterns were formed at the above $E_{OP}$ value, and the critical resolution (nm) was determined using SEM photographs.

Example 2

With the exceptions of replacing the triphenylsulfonium n-butanesulfonate (20 parts by weight) used in the example 1 with triphenylsulfonium n-octanesulfonate (23 parts by weight), and altering the blend quantity of EM to 1530 parts by weight, a positive resist composition solution was obtained in the same manner as the example 1.

The 20 parts by weight of triphenylsulfonium n-butanesulfonate and 23 parts by weight of triphenylsulfonium n-octanesulfonate represent substantially the same number of mols.

Subsequently, the thus obtained positive resist composition solution was subjected to the same evaluations as those described in the example 1. During these evaluations, the PAB conditions were altered to 110° C. for 90 seconds and the PEB conditions were altered to 90° C. for 90 seconds. The results are shown in Table 1.

Comparative Example 1

With the exceptions of replacing the triphenylsulfonium n-butanesulfonate (20 parts by weight) used in the example 1 with triphenylsulfonium nonafluorobutanesulfonate (30 parts by weight), and altering the blend quantity of EM to 1530 parts by weight, a positive resist composition solution was obtained in the same manner as the example 1.

The 20 parts by weight of triphenylsulfonium n-butanesulfonate and 30 parts by weight of triphenylsulfonium nonafluorobutanesulfonate represent substantially the same number of mols.

Subsequently, the thus obtained positive resist composition solution was subjected to the same evaluations as those described in the example 1. During these evaluations, the PAB conditions were altered to 110° C. for 90 seconds and the PEB conditions were altered to 110° C. for 90 seconds. The results are shown in Table 1.

TABLE 1

|  | Sensitivity [$\mu C/cm^2$] | Pattern shape | Resolution (L/S) [nm] |
|---|---|---|---|
| Example 1 | 16 | Rectangular | 60 |
| Example 2 | 22 | Rectangular | 60 |
| Comparative example 1 | 15 | T-top | 90 |

As is evident from the above results, the positive resist compositions of the examples 1 and 2 exhibited high resolution and excellent pattern shape, even though the component (B) was included at high concentration levels. Furthermore, the sensitivity was also excellent.

In contrast, although the comparative example 1 exhibited a high level of sensitivity, the resolution was poor, and the pattern shape was a T-top shape. It is thought that these observations reflect the fact that because the concentration of the component (B) was high, the sensitivity was high but the resolution deteriorated, and the fact that because a low molecular weight compound was used as the base material component, the dissolution-inhibiting effect caused by the component (B) was large.

The invention claimed is:

1. A positive resist composition, comprising:
   a base material for a pattern-forming material (A), which contains a protector (X1) of a polyhydric phenol compound (x) having two or more phenolic hydroxyl groups and a molecular weight of 450 to 1,500, in which a portion of said phenolic hydroxyl groups are protected with an acid-dissociable, dissolution-inhibiting group; and
   an acid generator compound (B) that generates an acid upon exposure,
   wherein the proportion of the protector (X1) within the component (A) is greater than 80% by weight;
   said component (B) comprises an onium salt-based acid generator (B1) with an alkylsulfonate ion as an anion; and
   said polyhydric phenol compound (x) is a compound represented by a general formula (I) shown below:

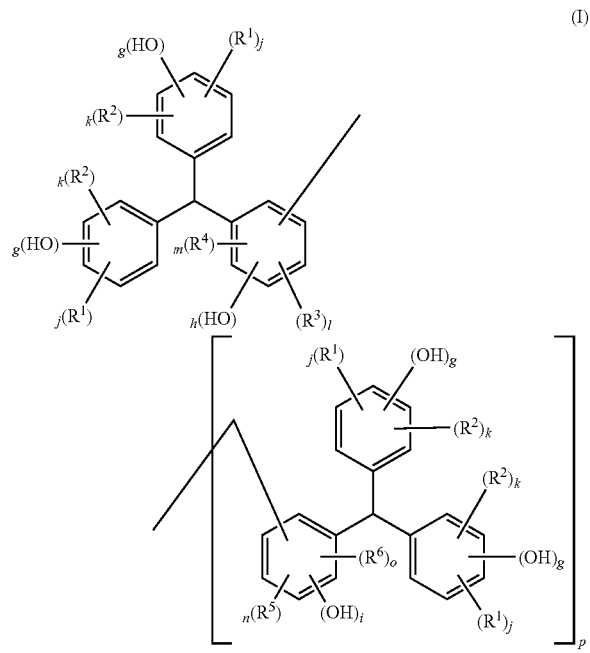

(wherein, $R^1$ through $R^6$ each represent, independently, an alkyl group of 1 to 10 carbon atoms or aromatic hydrocarbon group which may include a hetero atom within a structure thereof; g and j each represent, independently, an integer of 1 or greater, k represents either 0 or an integer of 1 or greater, and g+j+k is no greater than 5; h is an integer of 1 or greater, l and m each represent, independently, either 0 or an integer of 1 or greater, and h+l+m is no greater than 4; 1 is an integer of 1 or greater, n and o each represent, independently, either 0 or an integer of 1 or greater, and i+n+o is no greater than 4; and p is 1).

2. A positive resist composition according to claim 1, wherein said onium salt-based acid generator (B1) comprises an onium salt represented by a general formula (B-1) shown below:

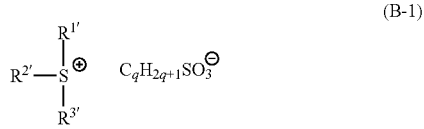

(wherein, $R^{1'}$ to $R^{3'}$ each represent, independently, an aryl group or alkyl group, and q represents an integer from 1 to 10).

3. A positive resist composition according to claim 1, wherein a molecular weight polydispersity (Mw/Mn) of said polyhydric phenol compound (x) is no higher than 1.5.

4. A positive resist composition according to claim 1, further comprising: a nitrogen-containing organic compound (D).

5. A method of forming a resist pattern, comprising:
   forming a resist film on a substrate using a positive resist composition according to any one of claim 1, 2, 3, and 4;
   exposing said resist film; and
   developing said resist film to form a resist pattern.

6. The positive resist composition according to claim 1, wherein the proportion of the protector (X1) within the component (A) is 100% by weight.

7. The positive resist composition according to claim 1, wherein the molecular weight of the polyhydric phenol compound (x) is within a range of 500 to 1,200.

8. The positive resist composition according to claim 1, wherein the phenolic hydroxyl group protection ratio within the component (A) is within a range from 5 to 50 mol %.

9. The positive resist composition according to claim 1, wherein the phenolic hydroxyl group protection ratio within the component (A) is within a range from 7 to 30 mol %.

* * * * *

UNITED STATES PATENT AND TRADEMARK OFFICE
CERTIFICATE OF CORRECTION

| | |
|---|---|
| PATENT NO. | : 7,897,319 B2 |
| APPLICATION NO. | : 11/572630 |
| DATED | : March 1, 2011 |
| INVENTOR(S) | : Daiju Shiono, Taku Hirayama and Hideo Hada |

Page 1 of 1

It is certified that error appears in the above-identified patent and that said Letters Patent is hereby corrected as shown below:

IN THE SPECIFICATIONS:

At Column 9, Line 38, Change "cyamide," to --cyanide,--.

At Column 9, Line 39, Change "cyamide," to --cyanide,--.

At Column 9, Line 39-40, Change "cyamide," to --cyanide,--.

At Column 9, Line 41, Change "cyamide," to --cyanide,--.

At Column 9, Line 42, Change "cyamide," to --cyanide,--.

At Column 9, Line 43, Change "cyamide," to --cyanide,--.

At Column 9, Line 44, Change "cyamide," to --cyanide,--.

At Column 9, Line 45, Change "cyamide," to --cyanide,--.

At Column 9, Line 47, Change "cyamide," to --cyanide,--.

At Column 9, Line 48-49, Change "cyamide," to --cyanide,--.

At Column 9, Line 52, Change "cyamide," to --cyanide,--.

At Column 14, Line 45, Change "1x100" to --x100--.

IN THE CLAIMS:

At Column 17, Line 1, In Claim 1, change "l and m" to --1 and m--.

At Column 17, Line 3, In Claim 1, change "1 is" to --l is--.

At Column 18, Line 6, In Claim 5, change "claim" to --claims--.

Signed and Sealed this
Twentieth Day of September, 2011

David J. Kappos
*Director of the United States Patent and Trademark Office*